United States Patent
Ikegawa et al.

(10) Patent No.: US 7,026,054 B2
(45) Date of Patent: Apr. 11, 2006

(54) LAMINATE UTILIZING A METAL LAYER ACTIVATED BY NITROGEN PLASMA TREATMENT

(75) Inventors: Naoto Ikegawa, Kadoma (JP); Naoyuki Kondo, Kadoma (JP); Kimiaki Nakata, Kadoma (JP)

(73) Assignee: Matsushita Electric Works, Ltd., Kadoma (JP)

( * ) Notice: Subject to any disclaimer, the term of this patent is extended or adjusted under 35 U.S.C. 154(b) by 345 days.

(21) Appl. No.: 09/871,896

(22) Filed: Jun. 4, 2001

(65) Prior Publication Data

US 2003/0068520 A1 Apr. 10, 2003

(30) Foreign Application Priority Data

Jun. 6, 2000 (JP) ........................ 2000-168461

(51) Int. Cl.
*B32B 15/04* (2006.01)

(52) U.S. Cl. ........................ 428/457; 428/458; 428/357; 428/364; 428/366; 428/323; 428/328; 428/330

(58) Field of Classification Search ................. 428/457, 428/458, 357, 364, 366, 323, 328, 330
See application file for complete search history.

(56) References Cited

U.S. PATENT DOCUMENTS

| | | | | | |
|---|---|---|---|---|---|
| 4,798,762 A | * | 1/1989 | Okada et al. | ................ | 428/285 |
| 4,943,606 A | * | 7/1990 | Inoue et al. | ................. | 523/457 |
| 5,178,962 A | * | 1/1993 | Miyamoto et al. | .......... | 428/463 |
| 5,474,853 A | * | 12/1995 | Watanabe et al. | ........... | 428/458 |
| 5,480,730 A | * | 1/1996 | Swisher et al. | ............. | 428/621 |
| 5,846,309 A | * | 12/1998 | Freeman et al. | .............. | 106/52 |
| 5,965,245 A | * | 10/1999 | Okano et al. | ................ | 428/209 |
| 6,025,056 A | * | 2/2000 | Machii et al. | .............. | 428/204 |
| 6,197,149 B1 | * | 3/2001 | Kobayashi et al. | ......... | 156/305 |
| 6,207,745 B1 | * | 3/2001 | Bersted et al. | .............. | 524/514 |

FOREIGN PATENT DOCUMENTS

JP     53-62175     * 11/1976

* cited by examiner

*Primary Examiner*—Kevin M. Bernatz
(74) *Attorney, Agent, or Firm*—Oblon, Spivak, McClelland, Maier & Neustadt, P.C.

(57) ABSTRACT

A laminate includes a metal layer which is formed on and covers a surface of an insulating substrate activated by a plasma treatment by any method selected from a sputtering method, a vacuum depositing method and an ion plating method. The substrate is obtained by molding a resin composition containing 20 to 150 parts by mass of a fibrous filler having an average fiber diameter of 0.1 to 5 μm and an average fiber length of 10 to 50 μm relative to 100 parts by mass of a base resin comprising a thermoplastic resin and a thermosetting resin.

8 Claims, No Drawings

LAMINATE UTILIZING A METAL LAYER ACTIVATED BY NITROGEN PLASMA TREATMENT

BACKGROUND OF THE INVENTION

1. Field of the Invention

The present invention relates to a laminate which can be suitably used for manufacturing resin-molded circuit substrates such as MID and the like and in which a metal layer is formed on an insulating substrate molded of a resin composition.

2. Description of the Background Art

A laminate obtained by metal covering-treating an insulating substrate can be formed into resin-molded circuit substrates such as MID (Molded Interconnection Device steric molded circuit) and the like by a semi-additive method, a laser method or the like.

Upon manufacturing of such the molded articles, there have been hitherto proposed methods described in JP 2714440 and JP-B 7-24328. In these previous techniques, an insulating substrate is obtained by molding a resin composition containing a liquid crystal polyester and a powdery filler having an average particle of 0.01 to 100 μm, preferably 0.1 to 30 μm or a fibrous filler having a fiber diameter of 1 to 30 μm and a fiber length of 5 μm to 1 mm, preferably 10 to 100 μm, and metal covering-treating the surface of this insulating substrate to form a metal layer thereon.

However, in the previous techniques described in JP 2714440, a chemical bond dose not exist between a molded resin and a metal layer as described that 'The surface of a metal is treated by any one method of sputtering, ion plating or vacuum deposition in the state where degassing of a molded article is performed in a vacuum tank while heating and at the same time the hardness of a superficial part is lowered as low as possible . . .'. For this reason, there was a problem on the adherability between a resin substrate and a metal layer, in particular, adherability after underwent the thermal load.

In addition, in the techniques described in JP-B 7-24328, the surface is subjected to the roughening treatment (etching) with a chemical solution and the irregular parts thus formed is metal covering-treated and, thus, the adherability is manifested based on the mechanical anchoring effects (anchoring effects) as described that 'A molded article composed of a composition containing an inorganic filler in a liquid crystalline polyester is subjected to the etching treatment in advance, which is thereafter dehydrated and dried and then the surface is treated with a metal by any one method of sputtering, ion plating and vacuum deposition . . .'. Thereupon, the surface smoothness of a molded article is deteriorated and, for this reason, there was a limit on precision of the circuit pattern. In addition, there was also a problem that the strength of the superficial layer is lowered by roughening of the surface of an insulating substrate. Furthermore, there was a problem that, when the etching treatment is not performed, if the plasma treatment is not conducted, the initial adhering force is low, being not practical.

On the other hand, in order to enhance the surface smoothness, the shape is defined and fibrous and finely-divided inorganic fillers are used. However, the shape defined therein of a filler is too large to stably maintain the adherability and suppress the linear expansion coefficient lower.

For example, where a resin composition containing 70 parts by mass of a glass fiber having a fiber diameter of 11 μm and a fiber length of 3 mm relative to 100 parts by mass is molded into an insulating substrate, when a cross-section of this insulating substrate is observed, a layer having an average thickness of 13 μm composed of only a resin without a filler is formed on the superficial layer of an insulating substrate and an average distance between glass fibers in a resin is as large as 45 μm and, thus, regions relatively rich in a resin are interspersed in an insulating substrate. For this reason, the strength of the superficial layer of an insulating substrate obtained is microscopically based only on the strength of a resin. In addition, when a stress is applied to an insulating substrate, the stress concentration occurs in the vicinity of a large filler such as a glass fiber and, thus, the better adhering strength can not be obtained between an insulating substrate and a metal layer.

In addition, when a fibrous filler is used and the strength of a superficial part of a substrate is improved to suppress the thermal expansion, and when the smoothness of a substrate is maintained, if the content of a filler is small or if a fiber length of a fibrous filler is small, the reinforcing effects can not be obtained sufficiently. In particular, the linear expansion coefficient becomes large, the adherability is lowered when a molded article is expanded or constricted by the thermal load applied to the molded article in a manufacturing step of the thermal load resulting from the environmental temperature change, and a stress becomes larger applied to a packaged part such as IC and the like which is packaged to a metal layer, leading to occurrence of the erroneous operation of an article.

In addition, when a fiber length of a fibrous filler is large, the fibrous filler is broken at kneading upon preparation of a resin composition or at molding of a resin composition into an insulating substrate and, thus, the reinforcing effects can not be obtained in some cases. In addition, since the fiber density per unit volume becomes smaller, the fiber density near the superficial layer of an insulating substrate becomes smaller and, for this reason, the stress is concentrated to fibers when an insulating substrate and a metal layer are broken and, thus, the better adherability can not be obtained. In addition, when molded into an insulating substrate by injection molding or the like, fibrous fillers tend to be oriented in a flowing direction of a resin composition. Since the breaking stress is differently concentrated in this direction of oriented fibrous fillers and in a direction orthogonal to this direction, the anisotropy occurs in the adherability between an insulating substrate and a metal layer. In this case, deformation due to the warpage or the thermal load at molding is caused by manifestation of anisotropy due to the fiber orientation and, thus, the surface smoothness is deteriorated. Further, there is a problem when packaged to IC and the like.

In addition, when the fiber density of a fibrous filler per unit volume is small, the shrinkage factor is different between a part where fibers are present and a part where fibers are not present, and thus the surface smoothness of the superficial layer is difficult to obtain when molding, leading to a problem that the disadvantage occurs when wire bonding is performed at packaging of loaded parts.

In addition, when the content of a fibrous filler is too large, the filler is exposed on the surface of an insulating substrate and, in this case, when the affinity between a filler and a metal layer is lower, the adherability between an insulating substrate and a metal layer is lowered, and the scatter is produced in the adhering force distribution. In addition, even when the affinity between a filler and a metal layer is high, the interface breakage occurs between the resin phase and the filler phase at the superficial layer of an insulating substrate and, thus, the adherability between an insulating substrate and a metal layer is apparently lowered.

SUMMARY OF THE INVENTION

The present invention was done in view of the above respects and an object thereof is to provide a laminate which can improve the dynamical strength, the thermal properties, and the adherability between a metal layer and an insulating substrate when the surface of an insulating substrate is activated by the plasma treatment and then a molded article is manufactured by metal covering treating the surface of an insulating substrate by any one of method of sputtering, vacuum deposition and ion plating, and which can decrease the noise from the packaged parts such as IC and the like and preventing failure of packaged parts such as LED (light emitting diode), PD element (light receiving element) when molded into a resin-molded circuit substrate.

The laminate one of the present invention features a laminate comprising a metal layer which is formed on and covers the surface of an insulating activated by the plasma treatment by any method selected from a sputtering method, a vacuum depositing method and an ion plating method, wherein the substrate is obtained by molding a resin composition containing 20 to 150 parts by mass of a fibrous filler having an average fiber diameter of 0.1 to 5 µm and an average fiber length of 10 to 50 µm relative to 100 parts by mass of a base resin comprising a thermoplastic resin and a thermosetting resin, and preferably having an average fiber diameter of 0.3 to 1 µm and an average fiber length of 10 to 30 µm relative to 100 parts by mass of a base resin.

The invention is further characterized in that 1 or 2 or more resins having at least 1 bond or functional group selected from an amido bond, a sulfide group, a cyano group, an ester group, a sulfone group, a ketone group, and an imido group are used as the base resin.

The invention is further characterized in that 1 or 2 or more resins selected from nylon 6, nylon 66, poly (phthalamide), polyphenylene sulfide, poly(ether nitrile), polyethylene terephthalate, polybutylene terephthalate, polysulfone, poly(ether sulfone), poly(ether ketone), poly (ether imide) and melt-type liquid crystal polyester are used as the base resin.

The invention is further characterized in that poly (phthalamide) is used as the base resin.

The invention is further characterized in that melt-type liquid crystal is used as the base resin.

The invention is further characterized in that titanate is used as the fibrous filler.

The invention is further characterized in that borate is used as the fibrous filler.

The invention is further characterized in that wallastonite is used as the fibrous filler.

The invention is further characterized in that at least 1 selected from potassium titanate, calcium titanate, and barium titanate is used as the titanate.

The invention is further characterized in that at least 1 selected from aluminium borate and magnesium borate is used as the borate.

The invention is further characterized in that at least 1 selected from titanate, borate and wallastonite is used as the fibrous filler.

The invention is further characterized in that the resin composition further contains an unshaped powdery filler having an average particle size of 0.1 to 20 µm.

The invention is further characterized in that the resin composition further contains a spherical filler having an average particle size of 0.1 to 20 µm.

The invention is further characterized in that wallastonite is used as the fibrous filler and kaolin is used as the unshaped powdery filler.

The invention is further characterized in that aluminium borate is used as the fibrous filler and silica is used as the spherical filler.

In the present invention, an insulating substrate may be composed of a core layer and a superficial layer containing a fibrous filler and covering the surface of a core layer, and a metal layer may be formed on the surface of this superficial layer.

In addition, in the present invention, an unshaped powdery filler may be contained in a core layer of an insulating substrate.

In addition, in the present invention, an insulating substrate may contain a fibrous filler and may be constructed such that a plurality of resin layers in which a fibrous filler is oriented in a different direction are laminated.

In addition, the present invention may be constructed such that orientation directions of fibrous fillers in resin layers are approximately orthogonal to orientation directions of fibrous fillers in the adjacent other resin layers.

In addition, the present invention may be formed by injection-molding respective resin layers.

DESCRIPTION OF THE PREFERRED EMBODIMENTS

Embodiments of the present invention will be explained below.

As a base resin, a thermosetting resin or a thermoplastic resin is used. It is preferable that a resin containing at least any bond or a functional group of an amido bond, a sulfide group and a cyano group.

As a resin having an amido bond, aromatic polyamide and the like such as nylon 6 (polyamide 6), nylon 66 (polyamide 66), nylon 46 (polyamide 46), nylon 11 (polyamide 11), nylon 6–10 (polyamide 6–10), nylon 12 (polyamide 12), poly(phthalamide) and the like may be used. As a resin having a sulfide group, polyphenylene sulfide and the like may be used. In addition, as a resin having a cyano group, poly(ether nitrile), acrylonitrile-butadiene-styrene resin (ABS resin) and the like may used.

Besides the above resins, resins having at least any bond or functional group of an ester bond, a sulfone group, a ketone group, and an imido group may be used. For example, as a resin having an ester bond, polyethylene terephthalate, polyarylate, polybutylene terephthalate and the like may be used. In addition, as a resin having a sulfone group, polysulfone, poly(ether sulfone) and the like may be used. In addition, as a resin having a ketone group, polyketone, poly(ether ether ketone), poly(ether ketone) and the like may be used. In addition, as a resin having an imido group, poly(ether imide), polyimide and the like may be used. In addition, a resin having an epoxy group, epoxy resin and the like may be used. In addition, syndiotactic polystylene may be used.

Among such the base resins, it is particularly preferable that poly(phthalamide) is used. In this case, a mixture of terephthalic acid and aliphatic alkylenediamine containing terephthalic acid at an amount of 60% by mass or more, or a polyphthalamide resin composition in which a carbon number 6 to 18 is incorporated and having limiting viscosity (η) of 0.6 to 2.0 dl/g can be used. Such the polyphthalamide is excellent in the thermal resistance and the dimensional stability, has the better flowability, has the slight mold staining, and has the better moldability. Although polyphenylene sulfide is excellent in the adherability and the flowability, there is a possibility that mold corrosion occurs due to production of sulfide gas. From a respect of the thermal resistance, a melting point is 280° C. and can not be used for lead free solder and, thus, it is more preferable that poly(phthalamide) is used.

As a base resin, it is also preferable that melt-type liquid crystal polyester (thermally melting liquid crystal polyester) having the excellent molding processibility, the thermal resistance and the dimensional stability is used as a main component. As a melt-type liquid crystal polyester, liquid crystal wholly aromatic polyesters I type, II type, III type and the like may be used.

When a resin composition containing melt-type liquid crystal polyester as a base resin is used, an insulating substrate can be formed by general injection molding. However, a resin composition injected into a mold for molding at molding undergoes the strong shearing force near an inner wall of a mold for molding and, as a result, a skin layer in which orientation directions of a resin are the same is formed on a superficial layer of an insulating substrate and, on the other hand, in its inner layer, the directions of fibers are not the same. This skin layer is also formed upon injection molding using other resins. However, when rigid melt-type liquid crystal polyester is used, a more highly oriented skin layer is formed. For this reason, a skin layer of an insulating substrate has anisotropy such that it has usually the extremely high mechanical strength and elasticity in a flowing direction of a resin composition (orientation direction of a resin) upon molding but becomes weak in a direction orthogonal to this flowing direction. However, since a filler described below is contained in a resin composition in the present invention, the strength of a skin layer is improved and, as a result, the better molding processibility, the thermal resistance and the dimensional stability are imparted to an insulating substrate and, at the same time, the adherability between an insulating substrate and a metal layer can be improved.

In addition, by using 2 or more resins as a base resin, the properties of an insulating substrate can be improved as compared with the case of the use of one kind of resin. For example, when a resin containing 100 parts by mass of tri(phthalamide) and 25 parts by mass of polyphenylene sulfide is used as a base resin, the adherability between an insulating substrate and a metal layer can be improved as compared with the case where only polyphthalamide is used as a base resin. In addition, in such a case, the adherability can be also improved when the thermal load is added to a laminate (see Examples 19 and 20 below). Here, it is preferable that, as a resin to be added to a resin as a main component in a base resin, a resin having the better adherability than that of a main component, a resin having the small linear expansion coefficient, and a resin having the excellent mechanical properties are used.

On the other hand, as a filler, a fibrous filler having an average fiber diameter of 0.1 to 5 μm and an average fiber length of 10 to 50 μm is used alone, or it is used together with at least any one of an unshaped powdery filler having an average particle size of 0.1 to 20 μm and a spherical filler having an average particle size of 0.1 to 20 μm.

As a fibrous filler, silicon carbide, silicon nitride, zinc oxide, alumina, calcium titanate, potassium titanate, barium titanate, aluminium borate, calcium silicate, magnesium borate, calcium carbonate, magnesium oxysulfate, wallastonite and the like can be used. In particular, when titanate such as potassium titanate, calcium titanate and barium titanate is used, the strength of a superficial layer of an insulating substrate can be improved and the adherability between an insulating substrate and a metal layer can be improved and, in addition, dielectric loss factor of an insulating substrate can be reduced and, at the same time, dielectric constant can be controlled in a broader range. In addition, when borate such as aluminium borate and magnesium borate is used, since the linear expansion coefficient of a filler is small, the linear expansion coefficient-reducing effects of an insulating substrate due to filling of a filler becomes very high and, a stress loaded to packaged parts such as IC chip and the like is reduced when a laminate is used for a resin-molded circuit substrate and accumulation of stress in packaged parts is suppressed and, thus, erroneous operation such as occurrence of the noise from the interior of packaged parts and damage of packaged parts can be prevented.

When an average fiber diameter of this fibrous filler is below 0.1 μm, the strength of a fibrous filler is lowered and, as a result, a fibrous filler is damaged by shearing when a base resin and a fibrous filler are kneaded upon preparation of a resin composition, or at molding of a resin composition into an insulating substrate, resulting in the cause for scatter of the physical properties of an insulating substrate. In addition, aggregation tends to be produced due to charge harbored by a fibrous filler and it becomes difficult to disperse a fibrous filler uniformly.

Conversely, when an average fiber diameter of a fibrous filler exceeds 5 μm, an amount of a fibrous filler to be filled in a resin composition is at a low level, exceeding the limit amount, and an amount of fibers per unit volume of a fibrous filler in a resin composition and an insulating substrate is lowered. As a result, a difference in the thermal expansion coefficient and shrinkage coefficient between a part where a fibrous filler is present and a part where a fibrous filler is not present in a resin composition and an insulating substrate becomes larger, the smoothness of an insulating substrate is deteriorated, and the smoothness of a metal layer formed on the surface of an insulating substrate is also deteriorated. Thus, the connectability of a wire at wire bonding of packaged parts such as IC chip and the like is deteriorated when a laminate is used for a resin-molded circuit substrate.

In addition, when an average fiber length of a fibrous filler is below 10 μm, the mechanical properties and thermal properties of a resin composition and an insulating substrate are improved to a certain degree, but insufficient and, for this reason, an insulating substrate is expanded or constricted by the thermal load applied to a laminate in a manufacturing step or the thermal load due to change in the environmental temperature, the adherability between an insulating substrate and a metal layer is reduced, a stress loaded to packaged parts such as IC and the like becomes larger and, as a result, a resistance value in the interior of packaged parts is changed, resulting in the cause for occurrence of the noises, or damage of packaged parts.

Conversely, when an average fiber length of a fibrous filler exceeds 50 μm, the strength of a fibrous filler is apparently reduced and, as a result, a fibrous filler is damaged by the shearing force when a base resin and a fibrous filler are kneaded upon preparation of a resin composition, or at molding of a resin composition into an insulating substrate, resulting in the cause for scatter of the physical properties of an insulating substrate. In addition, an amount of a fibrous filler to be filled in a resin composition is at a low level, exceeding the limit amount, an amount of fibers per unit volume of a fibrous filler in a resin composition and an insulating substrate is reduced, and the number of fibers in a superficial layer of an insulating substrate. In this case, there is a possibility that the better adherability is not obtained due to occurrence of stress concentration in fibers when broken near an interface between an adherability is not obtained due to occurrence of stress concentration fibers when broke near an interface between an insulating substrate and a metal layer. In addition, at molding into an insulating substrate, fibers tend to be oriented in a direction of injection of a resin composition (flowing direction) upon injection of a resin composition into a mold. There arises a difference in concentration of breaking stress between an orientation direction of fibers and a direction orthogonal to this direction and, there is a possibility that anisotropy occurs in the adherability between an insulating substrate and a metal layer. Further, as the content of a filler grows smaller, the fiber density per unit volume and, as a result, a difference in the thermal expansion coefficient and shrinkage between a part wherein a fibrous filler is present and a part where a fibrous filler is not present in a resin composition and an insulating substrate becomes larger, the surface smoothness is deteriorated at molding into an insulating substrate, the smoothness of an insulating substrate is deteriorated and, as a result, the connectability of a wire at wire bonding of packaged parts such as IC chip and the like is deteriorated when a laminate is used for a resin-molded circuit substrate.

In addition, when only a fibrous filler is used as a filler, the content of a fibrous filler in a resin composition is 20 to 150 parts by mass relative to 100 parts by mass of a base resin. In this case, the adherability between an insulating substrate and a metal layer can be further improved, an amount of the dimensional change when the thermal load is applied can be further reduced to decrease a stress loaded to packaged parts such as IC chip and the like, and occurrence of the noise from or of packaged parts can be prevented.

When the content of a fibrous filler relative to 100 parts by mass of a base resin is below 20 parts by mass, the linear expansion coefficient of an insulating substrate is increased, leading to deterioration of the dimensional stability. And, a stress loaded to packaged parts is increased when the thermal load is applied, and there is a possibility that the noises occur from packaged parts, or packaged parts are damaged. In addition, when the content exceeds 150 parts by mass, a filler tends to be exposed on the surface of an insulating substrate and, when the affinity between a fibrous filler and a metal layer is low, an interface between a fibrous filler and a metal layer is easily peeled, there is a possibility that the adherability between an insulating substrate and a metal layer is lowered. In addition, even when the affinity between a fibrous filler and a metal layer is high, there is a possibility that the adherability between an insulating substrate and a metal layer is apparently lowered by breakage of an interface between the resin phase and a fibrous filler in an insulating substrate on the surface of an insulating substrate. Further, when this content exceeds 150 parts by mass, it becomes difficult to pelletize a resin composition using an extruder before molded into an insulating substrate, or an insulating substrate molded from a resin composition becomes fragile and it becomes difficult to use as a circuit substrate.

In addition, when an unshaped powdery filler is used as a filler, zinc oxide, magnesium oxide, iron oxide, titanium oxide, aluminium borate, alumina, silica, calcium carbonate, calcium silicate, talc, mica, kaolin, graphite powder, carbon black, glass and the like can be used. When such an unshaped powdery filler is used, orientation of fillers at molding can be suppressed and, thus, occurrence of anisotropy of the properties of an insulating substrate molded from a resin composition can be suppressed. In particular, when borate such as aluminium borate, magnesium borate and the like is used, since the linear expansion coefficient of a filler is small, the linear expansion coefficient-reducing effects of an insulating substrate by filling of a filler becomes very high and, thus, erroneous operation such as occurrence of the noises from packaged parts such as IC and the like packaged to a laminate or damage of packaged parts can be further suppressed.

When an average particle size of this unshaped powdery filler is below 0.1 μm, aggregated masses tend to be produced on the surface due to distribution failure when a resin composition is molded into a pellet-like molded material using an extruder before molded into an insulating substrate, and it becomes difficult to obtain a molded material, or an insulating substrate molded from a resin composition becomes fragile, and it becomes difficult to use as a circuit substrate.

Conversely, when an average particle size of an unshaped powdery filler exceeds 20 μm, the content of an unshaped powdery filler is at a low level exceeding the limit amount, it becomes difficult to cause fillers to be dispersed sufficiently in a superficial layer of an insulating substrate, it becomes difficult to improve the strength of a superficial layer of an insulating substrate sufficiently or keep the nature of the interior of an insulating substrate uniformly, and there is a possibility that the adherability between an insulating plate and a metal layer can not be sufficiently improved.

When borate such as aluminium borate, magnesium borate and the like is used as an unshaped powdery filler, since the linear expansion coefficient of a filler is small, the linear expansion coefficient reducing effects of an insulating substrate by filling of a filler becomes very high and, thus, erroneous operation such as occurrence of the noises from packaged parts such as IC and the like packaging to a laminate or damage of packaged parts can be further suppressed.

As a spherical filler, alumina, silica, aluminium silicate and the like can be used. When such a spherical filler is used, orientation of fillers at molding can be suppressed, and occurrence of anisotropy of the properties such as the adherability, the strength and the like of an insulating substrate molded from a resin composition can be suppressed. In particular, when silica is used as a spherical filler, since the linear expansion coefficient of a filler is small, the linear expansion coefficient-reducing effects of an insulating substrate by filling a filler becomes very high and, thus, erroneous operation such as occurrence of the noises from packaged parts such as IC and the like packaged to a laminate or damage of packaged parts can be further suppressed.

When an average particle size of this spherical filler is below 0.1 μm, aggregated masses tend to be produced on the surface due to distribution failure when a resin composition is molded into a pellet-like molded material using an extruder before molded into an insulating substrate, and it becomes difficult to obtain a molded material, or an insulating substrate molded from a resin composition becomes fragile, and it becomes difficult to use as a circuit substrate in some cases.

Conversely, when an average fiber diameter of a spherical filler exceeds 20 μm, the content of a spherical filler is at a low level, exceeding the limit amount, it becomes difficult to distribute sufficiently a filler in a superficial layer of an insulating substrate, it becomes difficult to improve the strength of a superficial layer of an insulating substrate or keep the nature of the interior of an insulating substrate uniformly and, thus, there is a possibility that the adherability between an insulating substrate and a metal layer can not be sufficiently improved.

In addition, when a spherical filler and an unshaped powdery filler are used, it is preferable that 2 or more fillers having different peak values of a particle size distribution (central particle size) are used. Upon this, when central particle size values are different, fillers may be the same material or different material. Preferably, a filler having a central particle size of 0.1 to 0.5 μm and a filler having a central particle size of 1 to 5 μm are used together and, more preferably, a filler having a central particle size of 0.3 μm and a filler having a central particle size of 2 μm are used. Thereby, particles having a smaller diameters are arranged in gaps between particles having a larger diameter in a resin composition and, thus, an amount of a spherical filler to be filled in a resin composition can be increased.

More particularly, even when an amount of a filler relative to 100 parts by mass of a base resin in a resin composition is 400 parts by mass, a stable resin composition can be obtained and, at the same time, a stable insulating substrate can be molded from this resin composition. Like this, since a filler can be filled at a high density, the effects of decreasing the linear expansion coefficient of an insulating substrate become very high due to filling of a filler, and erroneous operation such as occurrence of the noises from packaged parts such as IC chip and the like packaged to a laminate or occurrence of damage of packaged parts can be further suppressed.

In addition, it is preferable that, as a fibrous filler as a filler, an unshaped powdery filler and a spherical filler are used together. When a fibrous filler is used as a filler, when a resin composition is injected into a mold for molding and hardened or solidified to mold an insulating substrate, fibrous fillers tend to be oriented along a resin flowing direction (injection direction). For that reason, there arises anisotropy in the properties such as the strength, the linear expansion coefficient and the like between this direction and a transverse direction or a thickness direction orthogonal thereto. To the contrary, by using an unshaped powdery filler and a spherical filler together, occurrence of a difference in the properties such as the linear expansion coefficient and the like between a resin flowing direction and a direction orthogonal thereto can be suppressed and occurrence of anisotropy in expansion and constriction can be suppressed when the thermal load is applied to a laminate, occurrence of distribution of stress concentration manner at an interface between a metal layer and an insulating substrate is suppressed in the resin flowing direction and in a direction orthogonal thereto, and occurrence of anisotropy in the adherability between an insulating substrate and a metal layer can be prevented.

Here, when a fibrous filler and a powdery filler are used together, a powdery filler is used preferably at 50 to 150 parts by mass, more preferably 100 parts by mass relative to 100 parts by mass of a fibrous filler. In this case, a total amount of fillers relative to 100 parts by mass of a base resin in a resin composition is preferably 50 to 100 parts by mass, more preferably 100 parts by mass.

In addition, when a fibrous filler and a spherical filler are used together, a spherical filler is used preferably at 50 to 150 parts by mass, more preferably 100 parts by mass relative to 100 parts by mass of a fibrous filler. In this case, a total amount of fillers relative to 100 parts by mass of a base resin in a resin composition is preferably 50 to 150 parts by mass, more preferably 100 parts by mass.

Upon manufacturing of an insulating substrate, the aforementioned base resin and fillers are mixed and kneaded to prepare a resin composition, which is, if needed, molded into a pellet using an extruder or the like to obtain a molded material. This resin composition or molded material is molded using a mold by injection molding or the like, to prepare an insulating substrate.

The surface of this insulating substrate is activated by the plasma treatment. More particularly, a pair of electrodes are arranged at upper and lower positions in a chamber and, at the same time, a high frequency source is connected to one electrode and other electrode is earthed. Between electrodes of a plasma treating apparatus thus constructed, an insulating substrate is arranged on an electrode. In this state, the chamber is evacuated to reduce pressure below $10^{-4}$ Pa and, thereafter, an active gas such as $N_2$, $O_2$ or the like is flown into the chamber and, at the same time, the gas pressure in the chamber is controlled at 8 to 15 Pa. Next, the high frequency of 13.56 Hz is applied to an electrode with a high frequency source for 10 to 100 seconds. Upon this, an active gas in a chamber is excited by discharge between electrodes to generate the plasma and, thereby, a cation and radical are formed. These cation and radical are collided against the surface of an insulating substrate to chemically activate the surface of an insulating substrate. In particular, by induced collusion of a cation against an insulating substrate, oxygen polar-groups and nitrogen polar groups which easily bind to a metal are introduced on the surface of an insulating substrate and, thereby, the adherability to a metal layer is improved. The plasma treating conditions are not limited to the aforementioned ones but can be performed in such a range that the surface of an insulating substrate can be activated. And the plasma treatment is performed in such a range that the surface of an insulating substrate is not excessively roughened in this plasma treatment process.

Then, a metal layer is formed on the surface of an insulating substrate activated by the aforementioned plasma treatment, by any one method of sputtering, vacuum deposition and ion plating in continuous process without opening to the atmosphere. Thereby, a metal layer and an insulating substrate become to have the high adherability by oxygen polar groups and nitrogen polar groups on the surface of an insulating substrate. Here, a metal layer can be formed of a simple substance metal or an alloy such as nickel, gold, aluminium, titanium, molybdenum, chromium, tungsten, tin, lead, brass, NiCr and the like.

When sputtering is performed, the DC sputtering format can be applied. In this case, for example, after an insulating substrate is arranged in a chamber, the chamber is evacuated to below a pressure of $10^{-4}$ Pa using a vacuum pump. In this state, an inert gas such as argon or the like is introduced into a chamber to a gas pressure of 0.1 Pa Further, application of 500 V direct voltage, a copper target is bombarded to form a copper layer having a thickness of 300 to 500 nm.

When vacuum deposition is performed, the electron beam heating vacuum deposition format can be applied. In this case, for example, a crucible in which copper is placed as a deposition material is arranged in a chamber. In this state, after the chamber is evacuated to a pressure below $10^{-3}$ Pa with a vacuum pump, acceleration voltage 10 kV is applied to generate a 400 to 800 mA electron flow, which is collided against a deposition material in a crucible to heat it. Thereby, a deposition material in a crucible is vaporized to form a copper layer having a thickness of 300 to 500 nm.

In case when an ion plating is conducted, a crucible in which copper is placed as a material is arranged in the chamber, and, at the same time, an induced antenna part is placed between the insulating substance and the crucible in the chamber. In this state, after the chamber is evacuated to a pressure below $10^{-4}$ Pa, acceleration voltage 10 kV is applied to generate a 400 to 800 mA electron flow, which is collided against a material in the crucible to heat it. Thereby, a material in a crucible is vaporized. Then, an inert gas such as argon or the like is introduced in the induced antenna part so that a gas pressure becomes 0.05 to 0.1 Pa. A 13.56 MHZ high frequency with output 500 W is applied to this induced antenna to generate the plasma. On the other hand, a 100 to 500 V direct voltage is applied to an insulating substrate as a bias voltage. Thereby, a copper layer having a thickness of 300 to 500 nm can be formed.

A fine circuit is formed on the thus formed metal layer of a laminate by a laser method. That is, the laser light is illuminated to a border between a circuit-formed part and a non-circuit-formed part to remove a metal in this border part, and a circuit-formed part is subjected to electrolytic plating. Then, the soft etching treatment is performed to remove a metal at a non-circuit-formed part, leaving a metal at a circuit-formed part and, thereby, a circuit having the desired pattern can be formed to obtain a resin-formed circuit substrate.

In the thus obtained laminate, a filler is sufficiently distributed also in a superficial layer of an insulating substrate, the strength of a superficial layer of an insulating substrate is microscopically improved remarkably and, at the same time, uniformity of the interior of an insulating substrate is obtained, improving the adherability between an insulating substrate and a metal layer. In addition, improvement in the distributing properties of a filler in an insulating substrate can reduce the linear expansion coefficient in an insulating substrate. For that reason, when a laminate is used as a circuit substrate, occurrence of the thermal stress at an interface due to a difference in linear expansion coefficients between an insulating substrate and a metal layer is suppressed when receiving a variety of thermal loads at manufacturing steps, and environmental test or the actual use environment, and decrease in the adhering strength between an insulating substrate and a metal layer can be suppressed when a laminate undergoes the thermal load. In addition, change in the shape of a laminate can be suppressed when a laminate receives such the thermal load, and accumulation of a stress in packaged parts can be suppressed and erroneous operation such as occurrence of the noises due to change in a resistance value in packaged parts and damage of packaged parts can be prevented.

In addition, since the surface of an insulating substrate does not need to be subjected to roughing upon formation of a metal layer and change in the shape when receives the thermal load is suppressed, a metal layer has the excellent surface smoothness. For that reason, the reliance of connection of elements to circuits can be improved when a laminate is used as a resin-molded circuit substrate, packaged parts are connected by wire bonding, or packaged by the flip chip manner. In particular, the great effects can be obtained in flip chip packaging where the high surface smoothness is required.

Further, since a metal layer has the excellent surface smoothness, when a circuit is formed on a laminate, it enables to make a very fine circuit. For example, it is possible to form a fine pattern having a line width of 0.03 mm, a line spacing of 0.03 mm (Line width=0.03 mm, Space width=0.03 mm).

Alternatively, upon preparation of an insulating substrate, an insulating substrate is constructed to consist of a superficial layer containing a fibrous filler arranged in a superficial layer and a core layer may be containing no fibrous filler, and a metal layer maybe formed on the surface of a superficial layer. Upon this, a superficial layer may be formed on only one side on which a metal layer is to be formed, of surface and back sides of a core layer. Alternatively, superficial layers may be on the entire surface of a core layer. In this case, an amount of a more expensive fibrous filler than an unshaped powdery filler can be reduced to save the manufacturing cost and, at the same time, the adherability between an insulating substrate and a metal layer can be maintained. Upon this, a filler dose not need to be incorporated into a core layer. However, when an unshaped powdery filler is incorporated into a core layer, the rigidity of the entire insulating substrate can be improved and, at the same time, the linear expansion coefficient of the entire insulating substrate can be reduced and, further, occurrence of anisotropy in the properties such as the strength, the linear expansion coefficient and the like due to orientation of fibrous fillers can be suppressed to further improve the adherability between a metal layer and an insulating substrate and, at the same time, application of a stress load to loaded parts such as IC and the like can be suppressed to prevent occurrence of the noises from and damage of loaded parts.

Upon preparation of an insulating substrate consisting of such the core layer and the superficial layer, a superficial layer may be formed on a core layer by a coating method, or a core layer and a superficial layer may be formed simultaneously.

When a coating method is applied, after a resin composition containing no filler or a resin composition containing an unshaped powdery filler is molded by molding such as injection molding or the like, a paint containing a fibrous filler can be coated thereon. This paint can be prepared by dispersing or dissolving a resin composition containing a fibrous filler and this paint can be coated by a method such as a spin coating dipping method or the like.

Alternatively, an insulating substrate can be obtained by laminating a plurality of resin layers which is formed of a resin composition containing a fibrous filler, and in which fibrous fillers are oriented at the same direction. In this case, orientation directions of fibrous fillers in each of resin layers are made to be different between adjacent resin layers. For example, three layers of resin layers are laminated to prepare an insulating substrate and, in this case, fibrous fillers in the second layer of a resin layer are oriented in a direction at 45° relative to an orientation direction of fibrous fillers in the first layer of a resin layer and, further fibrous fillers of the third layer of a resin layer are oriented at 45° relative to an orientation direction of fibrous fillers in the second layer of a resin layer.

When an insulating substrate is formed like this, anisotropy in the strength, the linear expansion coefficient and the like of each of the resin layers due to the same orientation direction of fibrous fillers are offset or supplemented by the adjacent resin layers whereby, anisotropy in the properties of an insulating substrate can be alleviated.

Alternatively, in preparing an insulating substrate by laminating a plurality of resin layers as described above, when an angle between orientation directions of fibrous fillers in mutual adjacent resin layers is made to be 90°, anisotropy in the properties of an insulating substrate can be further alleviated effectively. That is, in the resin layers in which fibrous fillers are oriented in the same direction, a great difference in the properties such as the strength, the linear expansion coefficient and the like is observed between this orientation direction and a direction orthogonal to this orientation direction. For this reason, by arranging orientation directions of fibrous fillers in mutual adjacent resin layers at an approximately right angle, anisotropy in the properties can be offset or supplemented effectively and, whereby, anisotropy in the properties of an insulating substrate can be further alleviated.

As described above, in preparing an insulating substrate by laminating a plurality of resin layers, each of the resin layers can be formed by molding a resin composition containing a fibrous filler by injection molding or the like. Alternatively, in obtaining an insulating substrate by laminating a plurality of mutual resin layers, an insert molding method and a two color molding method can be applied.

First, in molding the first layer of a resin layer, a resin composition in a gate direction, and the composition is solidified to prepare the first layer of a resin layer. In molding the second layer of a resin layer, the first layer of a resin layer is arranged in the other mold, a resin composition is injected in the mold in a gate direction, so as to be laminated on the first layer of a resin layer to obtain the second layer of a resin layer. In an example, a gate direction of the first layer of a resin layer is changed by 90° relative to a gate direction of the second layer of a resin layer at molding, and orientation directions of fibrous fillers in the adjacent first and second layers of the resin layers are arranged at an approximately right angle. Like this, by subjecting resin layers to insert molding successively and changing gate directions (injection direction for a resin composition) successively, resin layers can be laminated to form an insulating substrate.

Alternatively, resin layers are laminated by two color molding, for example, the first resin layer is molded and, thereafter, a mold is turned over and the second layer of a resin layer is molded. In this case, a position of a gate for molding the second layer of a resin layer is arranged so that a gate direction (injection direction of a resin composition) is made to be different from an orientation direction of a fibrous filler in the first layer of a resin layer, preferably at an orthogonal direction.

In the following respective Examples, Reference Examples and Comparative Examples, the plasma treatment was carried out as follows: between electrodes of a plasma treating apparatus, an insulating substrate is arranged on one of electrodes, a chamber is evacuated to reduced pressure of below $10^{-4}$ Pa, a $N_2$ gas and is flown therein and, at the same time, a gas pressure in the chamber is controlled at 10 Pa. A 13.56 Hz high frequency voltage is applied between electrodes for 30 seconds by a high frequency source.

In addition, sputtering is carried out as follows:

By applying the DC sputtering, first, an insulating substrate is arranged in a chamber, and the chamber is evacuated to a pressure of below $10^{-4}$ Pa with a vacuum pump. In this state, an inert gas such as argon and the like is introduced into the chamber to a gas pressure of 0.1 Pa. Further, by applying a 500 V direct voltage, a copper target is bombarded to form a copper layer having a thickness of 300 nm.

Next, vacuum deposition is carried out as follows: by applying the vacuum deposition electron beam heating, a chamber is evacuated with a vacuum pump to a pressure of $10^{-3}$ Pa, a 10 kV acceleration voltage is applied to generate a 400 mA electron stream to form a copper layer having a thickness of 300 nm.

Next, ion plating is carried out as follows: first, a chamber is evacuated to a pressure of below $10^{-4}$ Pa, and a 10 kV acceleration voltage is applied. Then, an inert gas such as argon or the like is introduced to a gas pressure of 0.1 Pa. In this state, a 200 V bias voltage is applied to an insulating substrate, and a 13.56 MHZ high frequency voltage of 500 W is applied to form a copper layer having a thickness of 300 nm.

EXAMPLES 1 TO 6

Comparative Example 1

A resin composition obtained by mixing a base resin and a filler shown in Table 1 at a rate of a filler also shown in Table 1 relative to 100 parts by mass of a base resin was pelletized with an extruder, which was injection-molded to an insulating substrate, 30 mm×40 mm×1 mm. This insulating substrate was subjected to the plasma treatment to activate the surface, and, thereafter, a metal layer composed of copper having a thickness of 300 nm by sputtering in Examples 1 and 2 and Comparative Example 1, vacuum deposition in Examples 3 and 4, and by ion plating in Examples 5 and 6. Then, a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

Concerning an insulating substrate in this laminate, the linear expansion coefficient was measured in an injection direction for a resin composition and a direction orthogonal thereto at molding of an insulating substrate, anisotropy in the linear expansion coefficient was assessed by placing the linear expansion coefficient in an injection direction for a resin composition at denominator and placing the linear expansion coefficient in a direction orthogonal thereto at numerator.

Concerning thus obtained laminate, the 90° peel strength of the copper plating membrane, which is the circuit for the insulating substrate, was measured for the flowing direction of the resin composition at molding the insulating substrate, and for the direction perpendicular to this direction, and anisotropy in the adherability was assessed by placing the 90° peel strength in an injection direction for a resin composition at denominator and placing the 90° peel strength in a direction orthogonal thereto at numerator.

Next, a circuit is formed on a laminate by a laser method, IC chips were assembled thereon. During the thermal load was applied thereto by retaining at a temperature of 160° C. for 1 hour, retaining at a temperature of −40° C. for 1 hour, and further reverting to room temperature, the current was supplied to IC chips to operate and, at the same time, output from IC was observed on an oscilloscope to measure the presence of occurrence of the noises from IC chips.

The results are shown in Table 1.

TABLE 1

| | Base resin | Filler Kind | Amount (part by mass) | Anisotropy in linear expansion coefficient ($\times 10^{-6}/°C$) | Anisotropy in adherability (N/mm) | Noise |
|---|---|---|---|---|---|---|
| Example 1 | Poly(phthalamide) | Fibrous potassium titanate (diameter 0.3–0.6 μm, length 10–20 μm) | 70 parts by mass | 35/27 | 0.8/0.7 | None |
| Example 2 | | Fibrous aluminium borate (diameter 0.5–1.0 μm, length 10–30 μm) | 70 parts by mass | 22/10 | 1.1/0.95 | None |
| Example 3 | | Fibrous potassium titanate (diameter 0.3–0.6 μm, length 10–20 μm) | 70 parts by mass | 35/27 | 0.7/0.6 | None |
| Example 4 | | Fibrous aluminium borate (diameter 0.5–1.0 μm, length 10–30 μm) | 70 parts by mass | 22/10 | 0.5/0.45 | None |
| Example 5 | | Fibrous potassium titanate (diameter 0.3–0.6 μm, length 10–20 μm) | 70 parts by mass | 35/27 | 1.0/0.85 | None |
| Example 6 | | Fibrous aluminium borate (diameter 0.5–1.0 μm, length 10–30 μm) | 70 parts by mass | 22/10 | 0.7/0.6 | None |
| Comparative Example 1 | | Glass fiber (diameter 11 μm, length 3 mm) | 70 parts by mass | 45/15 | 0.65/0.5 | Some |

As shown in the Table, in Examples 1 to 6 as compared with Comparative Example 1, the linear expansion coefficient of an insulating substrate is lower and the adherability between an insulating substrate and a metal layer is higher and, occurrence of the noises from a packaged parts was not perceived.

EXAMPLES 7 TO 16

A resin composition obtained by mixing a base resin and a filler shown in Table 2 at a rate of a filler also shown in Table 2 relative to 100 parts by mass of a base resin was pelletized with an extruder, which was injection-molded to an insulating substrate, 30 mm×40 min×1 mm. This insulating substrate was subjected to the plasma treatment to activate the surface and, thereafter, a metal layer composed of copper having a thickness of 300 nm was formed by sputtering. Then, a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

Concerning thus obtained laminate, the 90° peel strength of the copper plating membrane, which is the circuit for the insulating substrate, was measured. Concerning a laminate which had received the thermal load at 160° C. for 2 hours immediately after formation of a metal layer, the 90° peel strength was measured. The measurement results are shown in Table 2.

TABLE 2

| | Base resin | Filler Kind | Amount (parts by mass) | 90° peel strength (N/mm) After formation of a metal layer | After thermal load |
|---|---|---|---|---|---|
| Example 7 | Nylon 6 | Wallastonite (diameter 2 μm, length 30 μm) | 50 parts by mass | 0.71 | — |
| Example 8 | Nylon 66 | | | 0.78 | — |
| Example 9 | Poly(phthalamide) | | | 0.71 | — |
| Example 10 | Polyphenylene sulfide | | | 1.01 | 0.8 |
| Example 11 | Poly(ether nitrile) | | | 1.18 | 0.92 |
| Example 12 | Polybutylene terephthalate | | | 0.38 | 0.26 |
| Example 13 | Polysulfone | | | 0.4 | 0.63 |
| Example 14 | Poly(ether sulfone) | | | 0.9 | 0.42 |
| Example 15 | Poly(ether ether ketone) | | | 1.03 | 0.92 |
| Example 16 | Poly(ether imide) | | | 0.7 | 0.76 |

EXAMPLE 17

Comparative Example 2

A resin composition obtained by mixing a base resin and a filler shown in Table 3 at a rate of a filler also shown in Table 3 relative to 100 parts by mass of a base resin was pelletized with an extruder, which was injection-molded to an insulating substrate, 30 mm×40 mm×1 mm. This insulating substrate was subjected to the plasma treatment to activate the surface and, thereafter, a metal layer composed of copper having a thickness of 300 nm was formed by sputtering. Then, a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

Here, as a filler, fibrous potassium titanate having a fiber diameter of 0.3 to 0.6 μm and a fiber length of 10 to 20 μm was used in Example 17 and a glass fiber having a fiber diameter of 11 μm and a fiber length of 1 mm was used in. Comparative Example 2, and the contents thereof were 50 parts by mass relative to 100 parts by mass.

Concerning thus obtained laminate, the 90° peel strength of the copper plating membrane, which is the circuit for the insulating substrate, was measured for the flowing direction of the resin composition at molding the insulating substrate and for the direction perpendicular to this direction. In addition, concerning a laminate which had received the thermal load at 160° C. for 2 hours immediately after formation of a metal layer, the 90° peel strength was measured. The measurement results are shown in Table 3. When the same sample to that of Comparative Example 2 is not subjected to the plasma treatment, the peel strength could not be measured because a plated membrane had been peeled.

a fibrous filler having an average fiber diameter of 0.3 to 0.6 μm and an average fiber length of 10 to 20 μm as a fiber, the adherability between an insulating substrate and a metal layer was improved.

EXAMPLES 18 AND 19

A resin composition obtained by mixing a base resin and a filler shown in Table 4 at a rate of a filler also shown in Table 4 relative to 100 parts by mass of a base resin was pelletized with an extruder, which was injection-molded to an insulating substrate, 30 mm×40 mm×1 mm. This insulating substrate was subjected to the plasma treatment to activate the surface and, thereafter, a metal layer composed of copper having a thickness of 300 nm was formed by sputtering. Then a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

Concerning the thus obtained laminate, the 90° peel strength of the copper plating membrane, which is the circuit for the insulating substrate, was measured for the flowing direction of the resin composition at molding the insulating substrate and for the direction perpendicular to this direction. In addition, concerning a laminate which had received the thermal load at 160° C. for 2 hours immediately after

TABLE 3

| | Base resin | Filler Kind | Amount (parts by mass) | 90° peel strength (N/mm) |
|---|---|---|---|---|
| Example 17 | Melt-type liquid crystal polyester | Fibrous potassium titanate (diameter 0.3–0.6 μm, length 10–20 μm) | 50 parts by mass | 0.55 |
| Comparative Example 2 | | Glass fiber (diameter 11 μm, length 1 mm) | 50 parts by mass | 0.25 |

As shown in the Table, it was confirmed that, by using a melt-type liquid crystal polyester as a base resin and using formation of a metal layer, the 90° peel strength was measured. The measurement results are shown in Table 4.

TABLE 4

| | | Filler | | 90° peel strength (N/mm) | |
|---|---|---|---|---|---|
| | Base resin | Kind | Amount (parts by mass) | After formation of a metal layer | After thermal load |
| Example 18 | Poly(phthalamide) | Wallastonite (diameter 2 μm, length 30 μm) | 50 parts by mass | 0.71 | 0.54 |
| Example 19 | Poly(phthalamide) 100 parts by mass Polyphenylene sulfide 25 parts by mass | | | 0.95 | 0.7 |

As shown in the Table, it was confirmed that, by using poly(phthalamide) with polyphenylene sulfide added, the adherability between an insulating substrate and a metal layer was improved as compared with the case of poly (phthalamide) alone.

EXAMPLES 20, 21

A resin composition obtained by mixing a base resin and a filler shown in Table 5 at a rate of a filler also shown in Table 5 relative to 100 parts by mass of a base resin was pelletized with an extruder, which was injection-molded to an insulating substrate, 30 mm×40 mm×1 mm. This insulating substrate was subjected to the plasma treatment to activate the surface and, thereafter, a metal layer composed of copper having a thickness of 300 nm was formed by sputtering. Then, a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

Concerning the above insulating substrate, the linear expansion coefficient was measured in an injection direction for a resin composition and a direction orthogonal thereto at molding of an insulating substrate, an anisotropy of the linear expansion coefficient was assessed by placing the linear expansion coefficient in an injection direction for a resin composition at denominator and placing the linear expansion coefficient in a direction orthogonal thereto at numerator.

In addition, concerning the thus obtained laminate, the 90° peel strength of a metal layer relative to an insulating substrate immediately after formation of a metal layer in an injection direction for a resin composition at molding of an insulating substrate and a direction orthogonal thereto was measured, and anisotropy of the adherability was assessed by placing the 90° peel strength in an injection direction for a resin composition at denominator and placing the 90° peel strength in a direction orthogonal thereto at numerator.

The results are shown in Table 5

As shown by the Table, it was confirmed that, in Example 20 in which only aluminum borate as a fibrous filler was used as a filler, assessment of anisotropy in the linear expansion coefficient was 2.2 and assessment of anisotropy in adherability was 1.16, while, in Example 21 in which silica as a spherical filler was used as a filler in addition to aluminium borate as a fibrous filler, assessment of anisotropy in linear expansion coefficient was 0.96 and assessment of anisotropy in adherability was 1.0 and, thus, anisotropy was greatly alleviated.

EXAMPLES 22 AND 23

A resin composition obtained by mixing a base resin and a filler shown in Table 6 at a rate of a filler also shown in the Table 6 relative to 100 parts by mass of a base resin was pelletized with an extruder, which was injection-molded to an insulating substrate, 30 mm×40 mm×1 mm. This insulating substrate was subjected to the plasma treatment to activate the surface and, thereafter, a metal layer composed of copper having a thickness of 300 nm was formed by sputtering. Then, a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

Concerning the above insulating substrate, anisotropy in the linear expansion coefficient and adherability was assessed as in Examples 20 and 21.

The results are shown in Table 6.

TABLE 5

| | | Filler | | Anisotropy in linear expansion coefficient ($\times 10^{-6}/°C.$) | Anisotropy in adherability (N/mm) |
|---|---|---|---|---|---|
| | Base resin | Kind | Amount (parts by mass) | | |
| Example 20 | Poly(phthalamide) | Fibrous aluminium borate (diameter 0.5–1.0 μm, length 10–30 μm) | 70 parts by mass | 22/10 | 1.1/0.95 |
| Example 21 | | Fibrous aluminium (diameter 0.5–1.0 μm, length 10–30 μm) | 35 parts by mass | 23/24 | 0.9/0.9 |

TABLE 6

| | | Filler | | Anisotropy in linear expansion coefficient | Anisotropy in adherability |
|---|---|---|---|---|---|
| | Base resin | Kind | Amount | (×10⁻⁶/° C.) | (N/mm) |
| Example 22 | Poly(phthalamide) | Wallastonite (diameter 2 μm, length 30 μm) | 70 parts by mass | 45/30 | 0.75/0.6 |
| Example 23 | | Wallastonite (diameter 2 μm, length 30 μm) Kaolin (diameter 0.8 μm) | 35 parts by mass 35 parts by mass | 40/40 | 0.7/0.7 |

As shown by the Table, it was confined that, in Example 23 in which only wallastonite as a fibrous filler was used as a filler, assessment of anisotropy in the linear expansion coefficient was 1.5 and assessment of anisotropy in adherability was 1.25, while, in Example 24 in which kaolin as an unshaped powdery filler was used as a filler in addition to wallastonite as a fibrous filler, assessment of anisotropy in the linear expansion coefficient was 1.0 and assessment of anisotropy in the adherability was 1.0 and, thus, anisotropy was greatly alleviated.

In addition, after a circuit was formed on a laminate by a laser method, IC chips were assembled thereon, which was retained at a temperature of 160° C. for 1 hour, retained at a temperature of −40° C. for 1 hour and, further, reverted to room temperature and, thereafter, the presence of the noises from IC chips was measured.

The results are shown in Table 7.

TABLE 7

| | | Filler | | Linear expansion coefficient | Adherability | |
|---|---|---|---|---|---|---|
| | Base resin | Kind | Amount | (×10⁻⁶/° C.) | (N/mm) | Noise |
| Comparative Example 3 | Poly(phthalamide) | Fibrous aluminium borate (diameter 0.5–1.0 μm, length 10–30 μm) | 15 parts by mass | 45 | 1.35 | Some |
| Example 24 | | | 20 parts by mass | 35 | 1.27 | None |
| Example 25 | | | 150 parts by mass | 8 | 0.8 | None |
| Comparative Example 4 | | | 200 parts by mass | Molding failure | | |

EXAMPLES 24 and 25

Comparative Examples 3 and 4

A resin composition obtained by mixing a base resin and a filler shown in Table 7 at a rate of a filler also shown in Table 7 relative to 100 parts by mass of a base resin was palletized with an extruder, which was injection-molded to an insulating substrate, 30 mm×40 mm×1 mm. This insulating substrate was subjected to the plasma treatment to activate the surface and, thereafter, a metal layer composed of copper having a thickness of 300 mn was formed by sputtering. Then, a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

In addition, concerning the above insulating substrate, the linear expansion coefficient was measured in an injection direction for a resin composition at molding of an insulating, substrate.

In addition, concerning the thus obtained laminate, the 90° peel strength of the copper plating membrane, which is the circuit for the insulating substrate, was measured for the flowing direction of the resin composition at molding the insulating substrate.

As shown by the Table, it was confirmed that when the amount of a fibrous filler is below 20 parts by mass, it tends to increase in the linear expansion coefficient and occurrence of the noises from IC chips and, in Comparative Example 4, when the amount exceeds 150 parts by mass, a pellet was not obtained at molding, and thus a laminate could not be molded. In addition, it was confirmed that the better adherability and the linear expansion coefficient can be obtained.

EXAMPLES 26–28

A resin composition obtained by mixing a base resin and a filler shown in Table 8 at a rate of a filler also shown in Table 8 relative to 100 parts by mass of a base resin was pelletized with an extruder, which was injection-molded to an insulating substrate, 30 mm×40 mm×1 mm. This insulating substrate was subjected to the plasma treatment to activate the surface and, thereafter, a metal layer composed of copper having a thickness of 300 nm was formed by sputtering. Then, a circuit was formed by laser method and a circuit-formed part is subject to electrolytic copper plating. Further soft etching treatment was performed to remove the metal of a non-circuit-formed part, as well as to remain the metal of the circuit-formed part, thereby forming a circuit of a desired pattern shape.

In addition, concerning the above insulating substrate, the 90° peel strength of the copper plating membrane, which is the circuit for the insulating substrate, was measured for the flowing direction of the resin composition at molding the insulating substrate and for the direction perpendicular to this direction.

The results are shown in Table 8.

TABLE 8

|  | Base resin | Filler | | Specific permitivity | Dielectric loss tangent | Adherability (N/mm) |
| --- | --- | --- | --- | --- | --- | --- |
|  |  | Kind | Amount |  |  |  |
| Example 26 | Poly(phthalamide) | Calcium titanate (diameter 0.3–0.6 μm, length 10–20 μm) | 70 parts by mass | 95 | 0.0009 | 0.8 |
| Example 27 |  | Barium titanate (diameter 0.3–0.6 μm, length 10–20 μm) | 70 parts by mass | 240 | 0.017 | 0.76 |
| Example 28 |  | Fibrous aluminium borate (diameter 0.5–1.0 μm, length 10–30 μm) | 70 parts by mass | 5.6 | 0.001 | 1.1 |

As shown by the Table, in Examples 26 and 27 where a fibrous filler consisting of titanate as a filler is used, a metal layer and an insulating substrate have the high adherability, and an insulating substrate the lower dielectric loss tangents as compared with Example 28 where fibrous aluminium borate is used.

As described above, a laminate relating to claim 1 of the present invention is a laminate comprising a metal layer formed on the surface of an insulating substrate activated by the plasma treatment by any method selected from a sputtering method, a vacuum deposition method and an ion plating method, wherein said insulating substrate is formed by molding a resin composition containing a fibrous filler having an average fiber diameter of 0.1 to 5 μm and an average fiber length of 10 to 50 μm at an amount of 20 to 150 parts by mass relative to 100 parts by mass of a base resin comprising a thermoplastic or a thermosetting resin and, thus, a filler is sufficiently distributed also in a superficial layer of an insulating substrate, the strength of superficial layer of an insulating substrate is remarkably improved microscopically and, at the same time, the uniformity in the interior of an insulating substrate can be obtained, and the adherability between an insulating substrate and a metal layer can be improved. In addition, due to improvement in the distribution property of a filler in an insulating substrate, the liner expansion coefficient of an insulating substrate can be reduced and, when a molded article is used as a circuit substrate, occurrence of the thermal stress at an interface due to a difference in the liner expansion coefficient between an insulating substrate and a metal layer when received a variety of thermal load at a manufacturing step, an environment test or actual use environment, and reduction in the adhering strength between an insulating substrate and a metal layer can be suppressed when a molded article received a thermal load. In addition, change in the shape of an entire molded article can be suppressed when such the thermal load, and erroneous such as occurrence of noises due to change in a resistance value in packaged parts or damage of packaged part can be prevented. In addition, in forming a metal layer, the surface of an insulating substrate does not need to be subjected to the roughening and, since change in the shape is suppressed when received thermal load, a metal layer has the excellent surface smoothness, the h connection reliance between an element and a circuit can be improved when a molded article is used as a resin-molded circuit substrate, packaged parts are wire-bonded connected, or flip-chip packaged. In particular, in flip chip packaging for which the high surface smoothness is required, the effect is great. Further, due to the excellent surface smoothness harbored by a metal layer, when a circuit is formed on a molded article, remarkable fineness becomes possible.

In the invention described in claim 2, since 1 or 2 or more resins having at least 1 bond or functional group selected from an amide bond, a sulfide group, a cyano group, an ester bond, a sulfone group, a ketone group, and an imido group are incorporated as a base resin, the adherability between an insulating substrate and a metal layer can be further improved.

In addition, in the invention described in claim 3, since 1, 2 or more resins selected from nylon 6, nylon 66, poly (phthalamide), polyphenylene sulfide, poly(ether nitrile), polyethylene terephthalate, polybutylene terephthalate, polysulfone, poly(ether sulfone), poly(ether ketone), poly (ether imido) and melt-type liquid crystal polyester as a base resin, the better molding processibility, the heat resistance and the dimensional stability derived from melt-type liquid crystal polyester are imparted to an insulating substrate and, at the same time, the strength of a skin layer which is formed on a superficial of an insulating substrate and in which resins are highly oriented is effectively improved by a filler and, thus, the adherability between an insulating substrate and a metal layer can be further improved.

In addition, in the present invention, when at least 2 kinds of resins are incorporated in a resin composition for forming an insulating substrate, the properties such as the adherability, the thermal property, the mechanical property and the like of an insulating substrate as compared with the case where only 1 resin is used. For example, a resin having the more excellent adherability than that of a main component, a resin having a small linear expansion coefficient and a resin having the excellent mechanical property can be used together in addition to a resin which is a main component in a base resin.

In addition, in the present invention, when a fibrous filler and a superficial filler are used together as a filler which is incorporated into a resin composition for forming an insulating substrate, orientation of fibrous fillers which occurs at molding of a resin composition can be alleviated by a superficial filler and, thus, occurrence of anisotropy in the properties of a molded article can be suppressed.

Furthermore, in the present invention, when a fibrous filler and an unshaped powdery filler are used together as a filler which is incorporated into a resin composition for forming an insulating substrate, orientation of fibrous fillers which occurs at molding of a resin composition can be alleviated by an unshaped powdery filler and, thus, occurrence of anisotropy in the properties of a molded article can be suppressed.

Furthermore, in the present invention, when 20 to 150 parts by mass of a fibrous filler is incorporated into a resin composition for forming an insulating substrate relative to 100 parts by mass of a base resin, the liner expansion coefficient of an insulating substrate can be effectively reduced, the adhering strength between an insulating substrate and a metal layer can be further effectively maintained when a molded article receives the thermal load and, at the same time, erroneous operation such as occurrence of the noises and damage of packaged parts due to change in a resistance value in packaged parts can be further assuredly prevented. Further, embrittlement of a molded insulating substrate can be suppressed.

In addition, in the present invention, when titanate is incorporated as a fibrous filler into a resin composition for molding an insulating substrate, the strength of a superficial layer of an insulating substrate can be further improved, the adherability between an insulating substrate and a metal layer can be further improved, dielectric loss index (dielectric loss tangent) of an insulating layer can be reduced and, at the same time, specific permitivity can be controlled.

Furthermore, in the present invention, when borate is incorporated into a resin composition for molding an insulating substrate as a fibrous filler, the liner expansion coefficient of a filler itself is very low, the liner expansion coefficient of an insulating substrate can be further reduced, the adhering strength between an insulating substrate and a metal layer can be further effectively maintained when a molded article receives the thermal load and, at the same time, erroneous operation such as occurrence of noises and damage of packaged part due to change in a resistance value in packaged parts can be further assuredly prevented.

Furthermore, in the present invention, when an insulating substrate is constructed of a core layer, and a superficial layer which contains a fibrous filler and covers the surface of the core layer, and a metal layer is formed on the surface of this superficial layer, the adherability between a superficial layer containing a fibrous filler and a metal layer call be maintained and, at the same time, an amount of a fibrous filler to be used can be reduced, leading to decrease in the manufacturing cost.

Furthermore, in the present invention, when an unshaped powdery filler is contained in a core layer of an insulating substrate, the adherability between an insulating substrate and a metal layer can be maintained by a fibrous filler in a superficial layer and, at the same time, an amount of a fibrous filler to be used can be reduced, resulting in decrease in the manufacturing cost.

Furthermore, in the present invention, when an insulating substrate is constructed by laminating a plurality of resin layers which contain a fibrous filler and in which orientation directions of fibrous fillers are different, anisotropy in a direction generated by orientation of fibrous fillers can be offset or supplemented and anisotropy in the properties of an insulating substrate can be alleviated.

In addition, in the present invention, a direction of a fibrous filler in a resin layer is oriented such that it is orthogonal to an orientation direction for a fibrous fillers in the adjacent other resin layer, resin layers can be laminated consistent with a direction in which a difference in the properties such as the strength, the liner expansion coefficient and the like is greatly manifested to effectively offset or supplement anisotropy in the properties, whereby, anisotropy in the properties of an insulating substrate can be further alleviated.

Furthermore, in the present invention, when each resin layer is formed by injection molding, a plurality of resin layers containing a fibrous fillers and, at the same time, having different orientation directions of fibrous fillers can be lamination-molded while orientation directions of fibrous fillers in a resin layer are controlled by controlling injection directions for a resin composition.

Furthermore, in the present invention, when poly(phthelamide) is used as a base resin, an insulating substrate has the excellent heat resistance, moldability and dimensional stability.

What is claimed is:

1. A laminate comprising a copper layer which covers the surface of an insulating substrate, which substrate is activated by nitrogen plasma treatment and which copper layer is formed on said substrate by sputtering, vacuum depositing or ion plating, wherein said substrate is obtained by molding a base resin selected from the group consisting of an aromatic polyamide and a liquid crystal polyester containing 20 to 150 parts by mass of a fibrous filler selected from the group consisting of boric aluminum and potassium titanate having an average fiber diameter of 0.3 to 1.0 μm and an average fiber length of 10 to 30 μm relative to 100 parts by mass of the base resin.

2. The laminate according to claim 1, wherein the aromatic polyamide is poly(phthalamide).

3. The laminate according to claim 1, wherein the liquid crystal polyester is a melt-type liquid crystal polyester.

4. The laminate according to claim 1, wherein said substrate comprises a core layer containing no fibrous filler and a superficial layer containing said fibrous filler.

5. The laminate according to claim 4, wherein said core layer contains powdery filler.

6. The laminate according to claim 1, wherein said substrate comprises a plurality of resin layers containing said fibrous filler.

7. The laminate according to claim 6, wherein the orientation direction of said fibrous filler is different between adjacent layers.

8. The laminate according to claim 7, wherein said orientation direction of said fibrous filler is orthogonal between adjacent layers.

* * * * *